(12) United States Patent
Fukagawa et al.

(10) Patent No.: US 8,493,551 B2
(45) Date of Patent: Jul. 23, 2013

(54) SCANNING EXPOSURE APPARATUS, CONTROL APPARATUS AND METHOD OF MANUFACTURING DEVICE

(75) Inventors: Youzou Fukagawa, Utsunomiya (JP); Mitsuo Hirata, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 492 days.

(21) Appl. No.: 12/892,810

(22) Filed: Sep. 28, 2010

(65) Prior Publication Data
US 2011/0090475 A1 Apr. 21, 2011

(30) Foreign Application Priority Data
Oct. 19, 2009 (JP) .................................. 2009-240871

(51) Int. Cl.
*G03B 27/62* (2006.01)
*G03B 27/58* (2006.01)
*G03B 27/42* (2006.01)

(52) U.S. Cl.
USPC .................................. 355/75; 355/72; 355/53

(58) Field of Classification Search
USPC .................................. 355/52, 53, 72, 75, 30
See application file for complete search history.

(56) References Cited

U.S. PATENT DOCUMENTS
6,714,842 B1 3/2004 Ito

FOREIGN PATENT DOCUMENTS
JP 3755862 B2 3/2006
JP 2007-049056 A 2/2007

*Primary Examiner* — Peter B Kim
(74) *Attorney, Agent, or Firm* — Rossi, Kimms & McDowell LLP

(57) ABSTRACT

A scanning exposure apparatus includes a first feedback loop including a first controlled object including an original stage and controlling a position of the original stage, a second feedback loop including a second controlled object including a substrate stage and controlling a position of the substrate stage, and a feedback unit including a first calculator and feed backing a synchronization error between the original stage and the substrate stage to the first feedback loop and the second feedback loop via the first calculator, wherein a transfer function from a first target value for the first controlled object to a first controlled value of the first controlled object and that from a second target value for the second controlled object to a second controlled value of the second controlled object are equal, and the exposure is performed at least during a period in which the original and the substrate are accelerated.

8 Claims, 6 Drawing Sheets

SCANNING EXPOSURE APPARATUS, CONTROL APPARATUS AND METHOD OF MANUFACTURING DEVICE

BACKGROUND OF THE INVENTION

1. Field of the Invention

The present invention relates to a scanning exposure apparatus, a control apparatus, and a method of manufacturing a device.

2. Description of the Related Art

An exposure apparatus projects the pattern of an original (reticle) onto a substrate (for example, a wafer or a glass plate) by a projection optical system to expose the substrate. The substrate is coated with a photosensitive material (photoresist). The pattern of the original is transferred onto the photosensitive material as a latent image pattern by exposing the photosensitive material. The latent image pattern is developed into a physical pattern (resist pattern) through a development process. To transfer the pattern of the original onto the substrate, alignment between the original and the substrate is of prime importance. The original is supported by an original stage having an original chuck, while the substrate is supported by a substrate stage having a substrate chuck. The original stage and the substrate stage are driven by driving mechanisms (for example, linear motors) (neither is shown). An exposure apparatus which exposes a substrate to light limited to a region smaller than a shot region while moving both an original and the substrate is called a scanning exposure apparatus (or a scanner). The scanning exposure apparatus must scan the original and the substrate while synchronizing them with each other so that their synchronization error falls below a target synchronization error.

Japanese Patent No. 3755862 (FIG. 4 and paragraph "0031") discloses a synchronous position control apparatus applicable to, for example, a synchronous position control system for a wafer stage and a reticle stage. Japanese Patent No. 3755862 discloses an arrangement which obtains, as a synchronization error, the difference between the following position of a second position control means and a position obtained by multiplying the position of a first position control means by a coefficient K, and sends the synchronization error to the second control means via a synchronization correction means as a position command value.

The above-mentioned arrangement described in Japanese Patent No. 3755862 can lessen the influence that disturbance on a controlled object exerts on the synchronization error. Such control is called master-slave synchronization control. Unfortunately, in the master-slave synchronization control, the symmetry of response characteristics between axes deteriorates.

SUMMARY OF THE INVENTION

The present invention provides a technique advantageous in throughput of a process in which first and second objects are moved to be processed.

One of the aspects of the present invention provides a scanning exposure apparatus which performs an exposure of a substrate to radiant energy via an original while the original and the substrate are scanned, the apparatus comprising a first feedback loop which includes a first controlled object including an original stage that supports the original, and is configured to control a position of the original stage, a second feedback loop which includes a second controlled object including a substrate stage that supports the substrate, and is configured to control a position of the substrate stage, and a feedback unit which includes a first calculator, and is configured to feed back a synchronization error between the original stage and the substrate stage to the first feedback loop and the second feedback loop via the first calculator, wherein the apparatus is configured such that a transfer function from a first target value for the first controlled object to a first controlled value of the first controlled object and a transfer function from a second target value for the second controlled object to a second controlled value of the second controlled object are equal, and the exposure is performed at least during a period in which the original and the substrate are accelerated.

Further features of the present invention will become apparent from the following description of exemplary embodiments with reference to the attached drawings.

DESCRIPTION OF THE EMBODIMENTS

Embodiments of the present invention will be described below with reference to the accompanying drawings. Although a position control apparatus according to the present invention is applicable to various types of position control apparatuses each including two controlled objects, an example in which the position control apparatus according to the present invention is applied to an exposure apparatus will be given.

Figure 5:
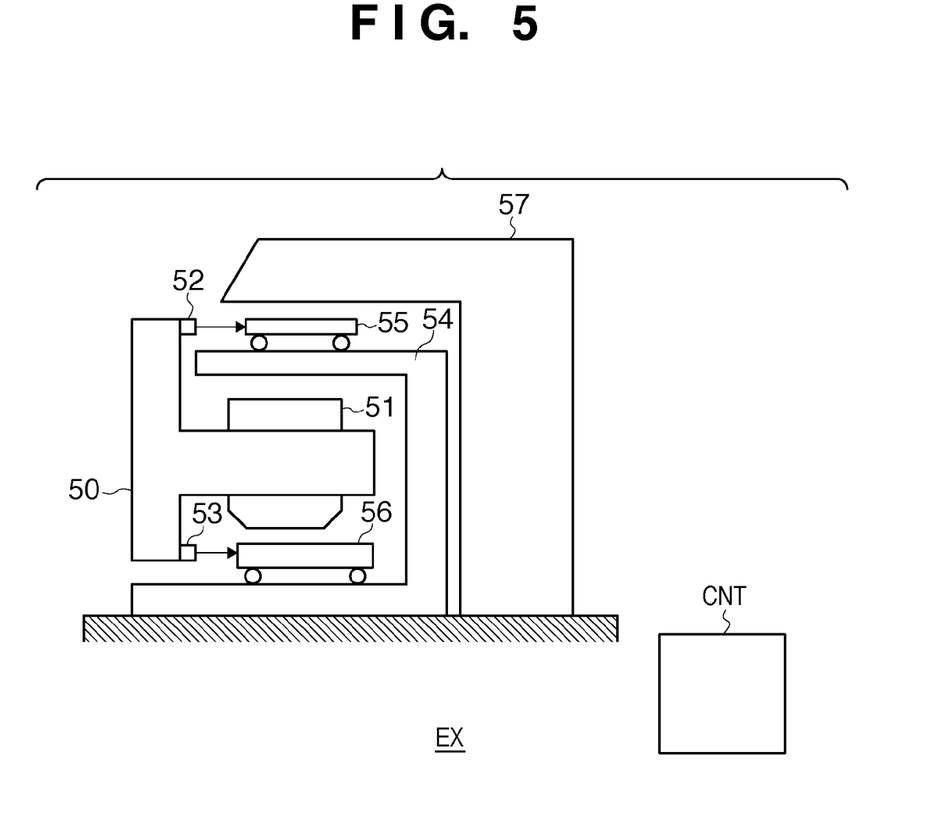
FIG. 5 is a view showing an example of the arrangement of an exposure apparatus.

The arrangement of an exposure apparatus to which the present invention is applicable will be described with reference to FIG. 5. An exposure apparatus EX shown in FIG. 5 is a scanning exposure apparatus. The exposure apparatus EX illuminates an original (reticle) by an illumination system or illumination optical system 57, and projects the pattern of the original onto a substrate (for example, a wafer or a glass plate) by a projection optical system 51, thereby exposing the substrate. The projection optical system 51 reduces the pattern of the original to 1/K, and projects it onto the substrate. The original is supported by an original stage 55 having an original chuck which holds it. The position of the original stage 55 is measured by a laser interferometer 52 mounted on a main frame 50 which supports the projection optical system 51. The original stage 55 is driven and positioned by an original stage driving mechanism (a driving mechanism for moving an original stage) (including, for example, a linear motor) (not shown) based on the measurement result obtained by the laser interferometer 52. The substrate is supported by a substrate stage 56 having a substrate chuck which holds it. The position of the substrate stage 56 is measured by a laser interferometer 53 mounted on the main frame 50. The substrate stage 56 is driven and positioned by a driving mechanism for moving a substrate stage based on the measurement result obtained by the laser interferometer 53. The driving mechanism includes, for example, a linear motor. The original stage 55 is driven in synchronism with the substrate stage 56 at a velocity K times that of the substrate stage 56 (K is the ratio of the velocity of the original stage 55 to that of the substrate stage 56). When K=1, no multiplier 15 is necessary. An error upon such synchronization control generates an overlay error between the pattern of the original and the pattern having already been formed on the substrate, and therefore must be minimized.

First Embodiment

Figure 1:
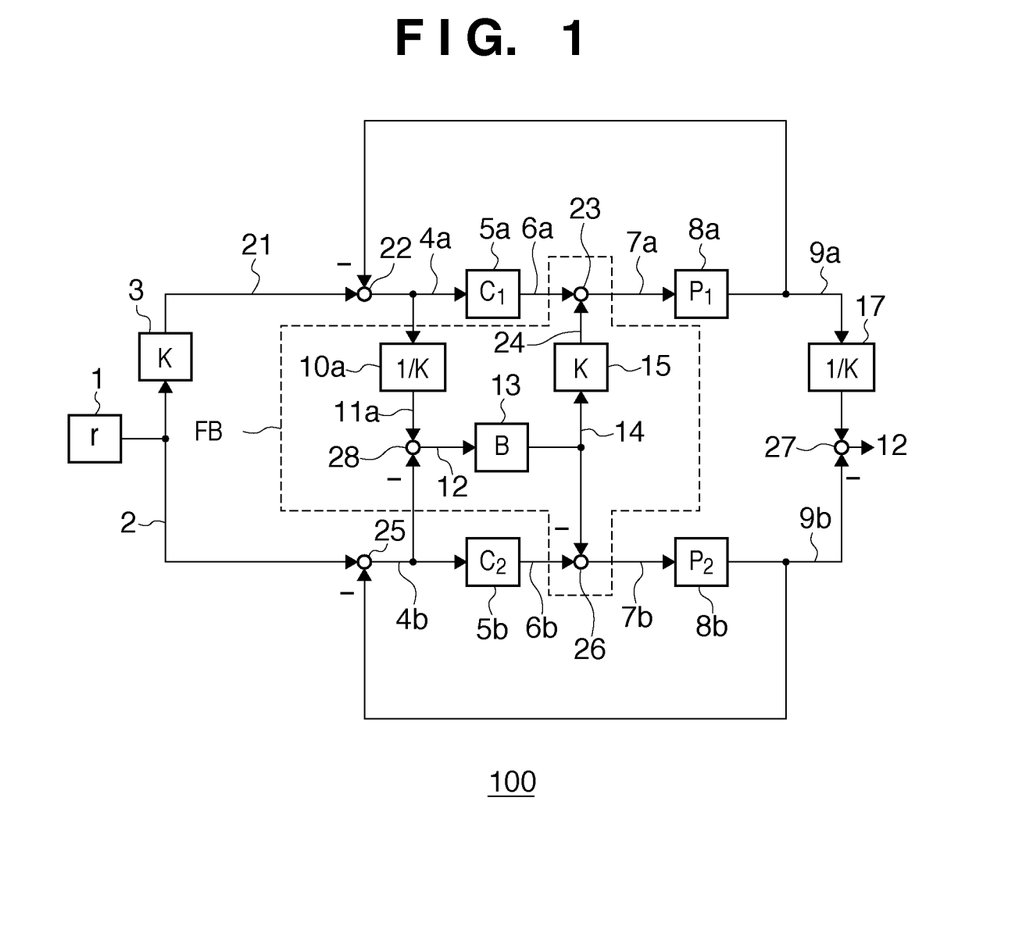
FIG. 1 is a block diagram showing the arrangement of a position control apparatus according to the first embodiment.

A position control apparatus 100 according to the first embodiment of the present invention will be described with reference to FIG. 1. The position control apparatus 100 can be designed as an apparatus which synchronously controls an original stage 55 and substrate stage 56 of an exposure apparatus EX as illustrated in, for example, FIG. 5. An example in which the position control apparatus 100 is designed as an apparatus that synchronously controls the original stage 55 and substrate stage 56 of the exposure apparatus EX will be explained below.

A first controlled object 8a includes the original stage (first stage) 55, an original stage driving mechanism (first stage driving mechanism) which drives it, and a laser interferometer (first measuring unit) 52, and has a first transfer characteristic or transfer function $P_1$. A second controlled object 8b includes the substrate stage (second stage) 56, a substrate stage driving mechanism (second stage driving mechanism) which drives it, and a laser interferometer (second measuring unit) 53, and has a second transfer characteristic (transfer function) $P_2$. In the position control apparatus 100, parts other than the first controlled object 8a and second controlled object 8b can be called a controller CNT. The position control apparatus 100 has a first feedback loop and a second feedback loop. The first feedback loop includes an error calculating unit or error calculator 22, a first compensator 5a, a first calculator 23, and the first controlled object 8a. The second feedback loop includes an error calculating unit or error calculator 25, a second compensator 5b, a second calculator 26, and the second controlled object 8b.

A target position generator 1 generates a target position (second target position) r of the substrate stage 56. A multiplier 3 generates a target position (first target position) 21 of the original stage 55 by multiplying the target position r of the substrate stage 56 by a coefficient K. The reason why the target position 21 of the original stage 55 is generated by multiplying the target position r of the substrate stage 56 by the coefficient K is that the original stage 55 must be moved at a velocity K times that of the substrate stage 56. An error calculating unit 22 generates a control error 4a for the original stage 55 by subtracting a position 9a of the original stage 55 measured by the laser interferometer 52 which forms a part of the first controlled object 8a from the target position 21 of the original stage 55. The first compensator 5a generates a first command value 6a by multiplying the control error 4a by a first transfer characteristic (transfer function) $C_1$. Note that the first transfer characteristic $C_1$ can include at least one of, for example, a proportional element (P), an integral element (I), and a derivative element or a differential element (D). The first calculator 23 generates a corrected command value (to be referred to as a first corrected command value hereinafter) 7a by adding a first correction value 24 to the first command value 6a. The original stage driving mechanism which forms a part of the first controlled object 8a drives the original stage 55 which forms another part of the first controlled object 8a, in accordance with the first corrected command value 7a.

The error calculating unit 25 generates a control error 4b for the substrate stage 56 by subtracting a position 9b of the substrate stage 56 measured by the laser interferometer 53 which forms a part of the second controlled object 8b from a target position 2 of the substrate stage 56. The second compensator 5b generates a second command value 6b by multiplying the control error 4b by a second transfer characteristic (transfer function) $C_2$. Note that the second transfer characteristic $C_2$ can include at least one of, for example, a proportional element (P), an integral element (I), and a derivative element or a differential element (D). The first transfer characteristic $C_1$ of the first compensator 5a and the second transfer characteristic $C_2$ of the second compensator 5b are preferably determined to satisfy $C_1P_1=C_2P_2$. The second calculator 26 generates a corrected command value (to be referred to as a second corrected command value hereinafter) 7b by subtracting a second correction value 14 from the second command value 6b. The substrate stage driving mechanism which forms a part of the second controlled object 8b drives the substrate stage 56 which forms another part of the second controlled object 8b, in accordance with the second corrected command value 7b. $C_1P_1$ is the transfer function from the first target position 21 to the position 9a of the original stage 55 for the first controlled object 8a, and $C_2P_2$ is the transfer function from the second target position r to the position 9b of the substrate stage 56 for the second controlled object 8b.

A multiplier 17 multiplies the position 9a of the original stage 55 measured by the laser interferometer 52 which forms a part of the first controlled object 8a by 1/K. A calculator 27 generates a synchronization error 12 by subtracting the position 9b of the substrate stage 56 measured by the laser interferometer 53 which forms a part of the second controlled object 8b from the position 9a multiplied by 1/K.

A calculator 10a generates a control error 11a corresponding to the scale on the substrate stage 56 by multiplying the control error 4a by 1/K. A calculator 28 generates a synchronization error 12' by subtracting the control error 4b from the control error 11a. A calculator 13 generates a second correction value 14 by multiplying the synchronization error 12' by a predetermined feedback transfer characteristic B. Since the synchronization error 12' is equivalent to the synchronization error 12 generated by the calculator 27, the calculator 13 may use the synchronization error 12' in place of the synchronization error 12. A multiplier 15 generates a first correction value 24 by multiplying the second correction value 14 by K. The feedback transfer characteristic B can include at least one of, for example, a proportional element (P), an integral element (I), and a derivative element or a differential element (D). The calculator 10a, calculator 28, calculator 13, multiplier 15, first calculator 23, and second calculator 26 form a synchronization error feedback unit FB which feeds back the synchronization error 12' or 12 to both the first feedback loop and the second feedback loop.

In this embodiment, the synchronization error 12' or 12 is fed back to both the first feedback loop and the second feedback loop. This makes it possible to improve the symmetry of response characteristics between the two feedback loops. Note that because the first target position 21 of the first controlled object 8a is K times the second target position r of the second controlled object 8b, the amount of feedback of the synchronization error 12' or 12 to the first controlled object 8a is K times that to the second controlled object 8b. Moreover, the transfer characteristic $C_1$ of the first compensator 5a and the second transfer characteristic $C_2$ of the second compensator 5b are preferably determined to satisfy $C_1P_1=C_2P_2$. This amounts to equalizing the response characteristic of the original stage 55 to the target position of the original stage 55, and that of the substrate stage 56 to the target position of the substrate stage 56. This improves the symmetry of the first and second feedback loops.

Second Embodiment

Figure 2:
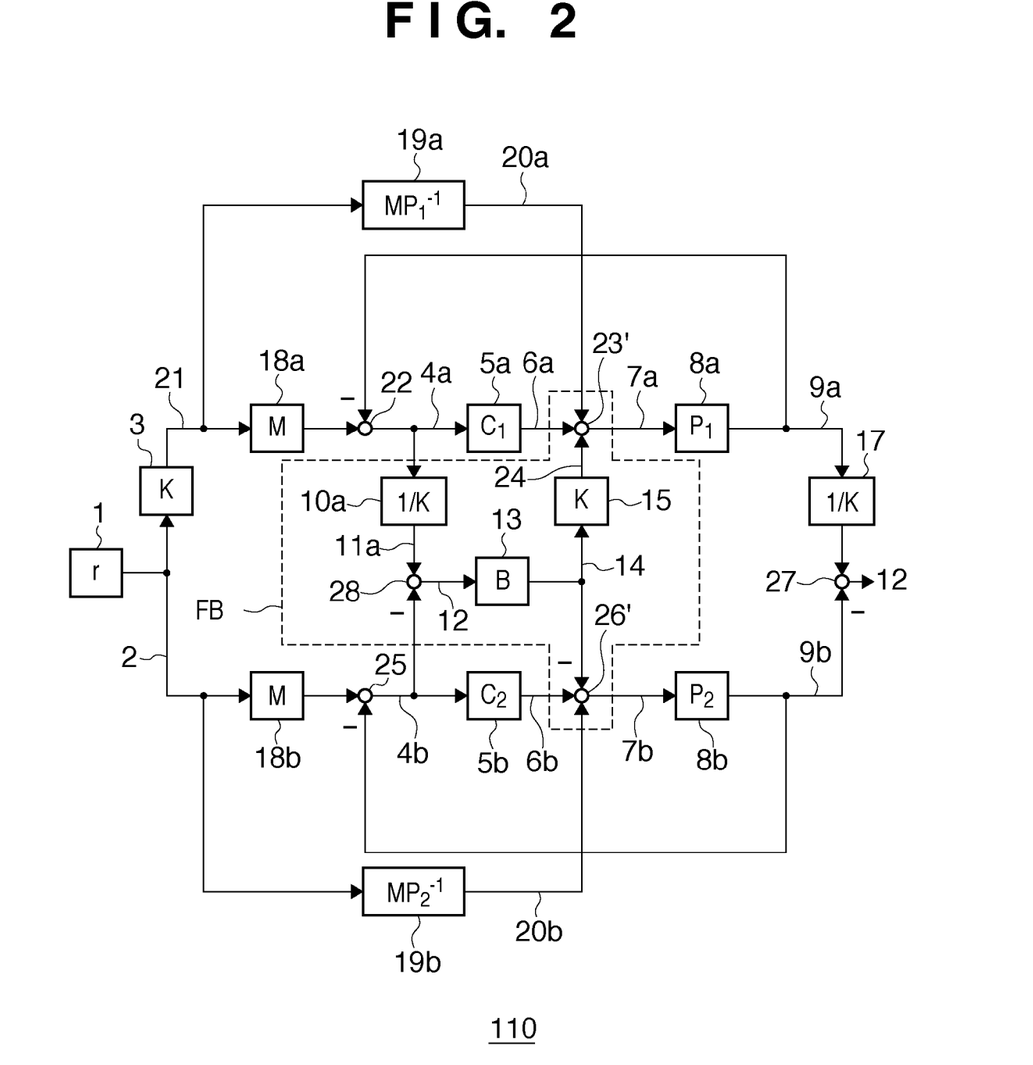
FIG. 2 is a block diagram showing the arrangement of a position control apparatus according to the second embodiment.

A position control apparatus 110 according to the second embodiment of the present invention will be described with reference to FIG. 2. The second embodiment will give an improvement to the first embodiment. Note that the same reference numerals as in the constituent elements of the position control apparatus 100 according to the first embodiment denote the same constituent elements of the position control apparatus 110 in the second embodiment. The second embodiment is suitable when a first transfer characteristic (transfer function) $P_1$ of a first controlled object 8a including an original stage 55, and a second transfer characteristic (transfer function) $P_2$ of a second controlled object 8b including a substrate stage 56 are too complex to sufficiently equalize the transfer characteristics $C_1P_1$ and $C_2P_2$ described earlier. In the position control apparatus 110, parts other than the first controlled object 8a and second controlled object 8b can be called a controller CNT.

A first reference model 18a and second reference model 18b each having a transfer characteristic (transfer function) M are connected between a multiplier 3 and an error calculating unit 22 and between a target position generator 1 and an error calculating unit 25, respectively. Hence, a first reference target position obtained by multiplying a target position 21 (Kr) by the transfer characteristic M is provided to the error calculating unit 22. Also, a second reference target position obtained by multiplying a target position r by the transfer characteristic M is provided to the error calculating unit 25.

The target position 21 (Kr) is also provided to a first characteristic assimilating unit 19a having a transfer characteristic $MP_1^{-1}$. The first characteristic assimilating unit 19a generates a third correction value 20a by multiplying the target position 21 by the transfer characteristic $MP_1^{-1}$. A first calculator 23' generates a corrected command value (to be referred to as a first corrected command value hereinafter) 7a by adding a first correction value 24 and a third correction value 20a to a first command value 6a. The target position r is also provided to a second characteristic assimilating unit 19b having a transfer characteristic $MP_2^{-1}$. The second characteristic assimilating unit 19b generates a fourth correction value 20b by multiplying the target position 21 by the transfer characteristic $MP_2^{-1}$. A second calculator 26' generates a corrected command value (to be referred to as a second corrected command value hereinafter) 7b by subtracting a second correction value 14 from a second command value 6b, and adding a fourth correction value 20b to the difference. Providing the characteristic assimilating units 19a and 19b makes it possible to bring the transfer characteristic in the first feedback loop close to that in the second feedback loop, independently of transfer characteristics $C_1$ and $C_2$ of first and second compensators 5a and 5b, respectively.

First Exposure Control Example

Figure 3:
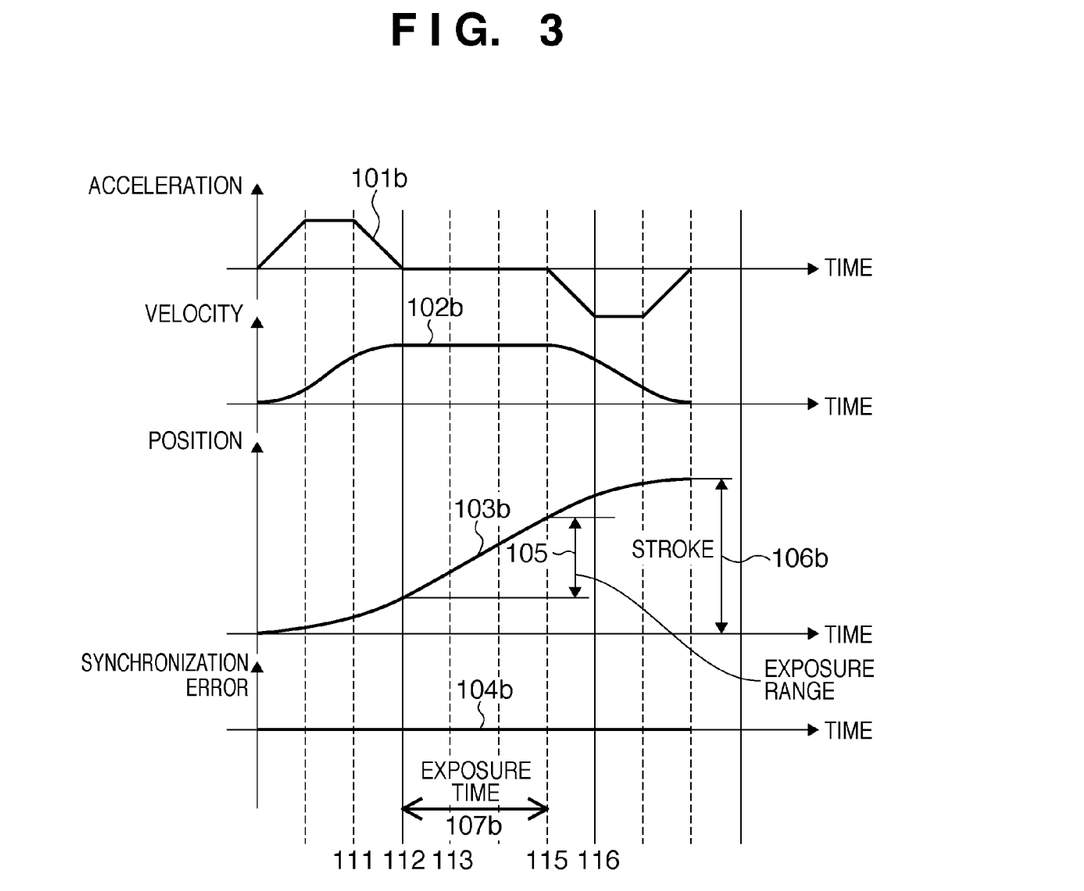
FIG. 3 is a graph showing the first exposure control example.

The first exposure control example in an exposure apparatus EX to which the position control apparatus according to the first or second embodiment is applied will be described with reference to FIG. 3. Referring to FIG. 3, an acceleration 101b, a velocity 102b, and a position 103b indicate the acceleration, velocity, and position, respectively, of a substrate stage 56. Reference numeral 104b denotes a synchronization error 12 or 12' between an original stage 55 and the substrate stage 56.

In the first exposure control example, a controller CNT controls an exposure operation so that an exposure of a shot region on a substrate starts as soon as the velocities of the original stage 55 and substrate stage 56 become constant. This makes it possible to shorten both the time taken to expose each shot region, and the strokes (moving distances) of the original stage 55 and substrate stage 56. A scanning exposure apparatus must have a small synchronization error between the original stage 55 and the substrate stage 56, and must also irradiate the substrate with light having energy constant per unit area. Hence, this apparatus performs a scanning exposure while maintaining the exposure dose and the scanning velocity constant. In the example shown in FIG. 3, since the synchronization error is sufficiently small at a time 112 when the velocity of the substrate stage 56 has become constant, the controller CNT controls an exposure operation so that an exposure starts from the time 112. Referring to FIG. 3, an exposure range 105 is the length of a shot region in the scanning direction, and the substrate is exposed until a time 115 when the substrate stage 56 will have moved by the exposure range 105. An exposure time 107b that is the time interval between the times 112 and 115 is a value obtained by dividing the exposure range 105 by the scanning velocity of the substrate stage 56. After the scanning exposure is completed, the controller CNT immediately stops the original stage 55 and substrate stage 56.

Figure 6:
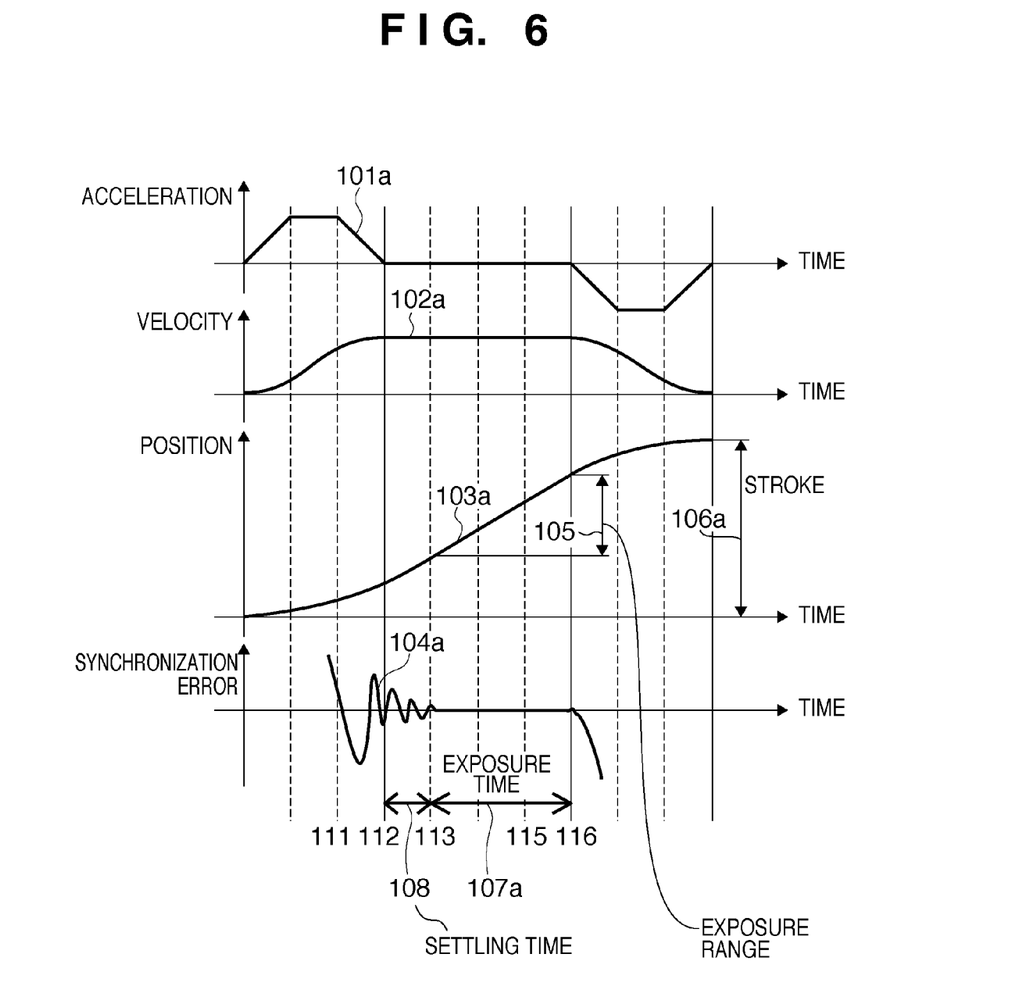
FIG. 6 is a graph showing a comparative example.

FIG. 6 shows a comparative example in which a scanning exposure starts after a settling time 108 from when the velocities of the original stage 55 and substrate stage 56 have become constant until the synchronization error falls within a tolerance. Referring to FIG. 6, an acceleration 101a, a velocity 102a, and a position 103a indicate the acceleration, velocity, and position, respectively, of the substrate stage 56. Reference numeral 104a denotes a synchronization error between the original stage 55 and the substrate stage 56. A stroke 106b of the substrate stage 56, which is necessary to expose one shot region, in the first exposure control example is longer than a stroke 106a in the comparative example shown in FIG. 6 by a distance corresponding to the settling time 108.

Second Exposure Control Example

Figure 4:
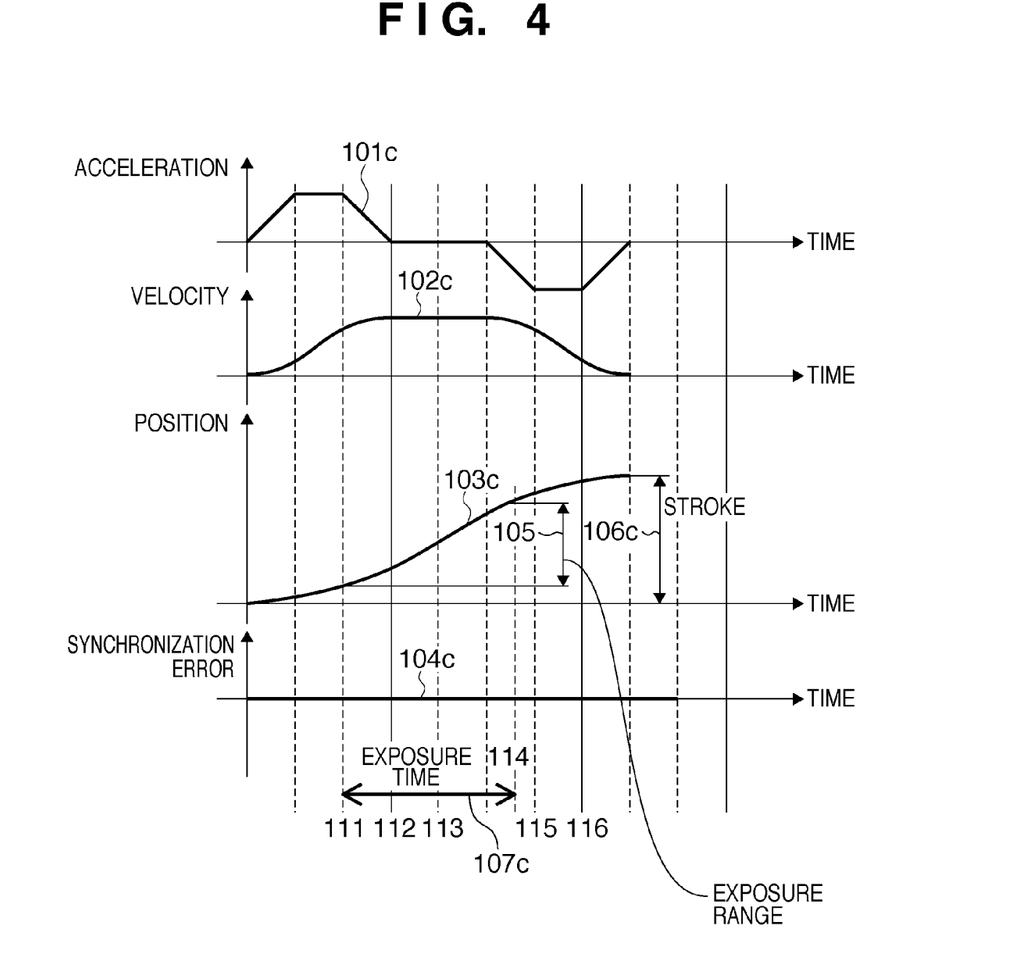
FIG. 4 is a graph showing the second exposure control example.

The second exposure control example in an exposure apparatus EX to which the position control apparatus according to the first or second embodiment is applied will be described with reference to FIG. 4. Referring to FIG. 4, an acceleration 101c, a velocity 102c, and a position 103c indicate the acceleration, velocity, and position, respectively, of a substrate stage 56. Reference numeral 104c denotes a synchronization error 12 or 12' between an original stage 55 and the substrate stage 56.

In the second exposure control example, a controller CNT controls an exposure operation so that an exposure of a shot region on a substrate starts before the velocities of the original stage 55 and substrate stage 56 become constant, for example, at the time when the acceleration starts to decrease. This makes it possible to shorten both the time taken to expose each shot region, and the strokes (moving distances) of the original stage 55 and substrate stage 56.

In the second exposure control example, the velocities of the original stage 55a and substrate stage 56 during an exposure time 107c do not stay constant. Hence, to maintain the energy of light applied to the substrate per unit area constant, the controller CNT controls a light source in an illumination system 57 so that the energy of light applied to the substrate per unit time becomes proportional to the velocity of the substrate stage 56.

In the example shown in FIG. 4, since the synchronization error 12 is sufficiently small even at a time 111 when the original stage 55 and substrate stage 56 accelerate at positive accelerations, the controller CNT controls an exposure operation so that an exposure starts from the time 111. The controller CNT then controls the exposure operation so that the substrate is exposed until a time 114 when the substrate stage 56 will have moved by an exposure range 105. The exposure time 107c in the second exposure control example is longer than the exposure time 107b in the first exposure control example, but the scanning exposure is completed earlier in the former example than in the latter example. Thus, a stroke 106c of the substrate stage 56, which is necessary to expose one shot region, in the second exposure control example is shorter than the stroke 106b in the first exposure control example.

[Method of Manufacturing Device]

A method of manufacturing a device according to an embodiment of the present invention can be used to manufacture devices such as a semiconductor device and a liquid crystal device. The method can include a step of exposing a substrate coated with a photosensitive agent using the above-mentioned exposure apparatus, and a step of developing the exposed substrate. The method of manufacturing a device can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-240871, filed Oct. 19, 2009, which is hereby incorporated by reference herein in its entirety.

What is claimed is:

1. A scanning exposure apparatus which performs an exposure of a substrate to radiant energy via an original while the original and the substrate are scanned, the apparatus comprising:
a first feedback loop which includes a first controlled object including an original stage that supports the original, and is configured to control a position of the original stage;
a second feedback loop which includes a second controlled object including a substrate stage that supports the substrate, and is configured to control a position of the substrate stage; and
a feedback unit which includes a first calculator, and is configured to feed back a synchronization error between the original stage and the substrate stage to the first feedback loop and the second feedback loop via the first calculator,
wherein the apparatus is configured such that a transfer function from a first target value for the first controlled object to a first controlled value of the first controlled object and a transfer function from a second target value for the second controlled object to a second controlled value of the second controlled object are equal, and the exposure is performed at least during a period in which the original and the substrate are accelerated.

2. A scanning exposure apparatus which performs an exposure of a substrate to radiant energy via an original while the original and the substrate are scanned, the apparatus comprising:
a first feedback loop which includes a first controlled object that has a first transfer function and includes an original stage that supports the original, and is configured to control a position of the original stage;
a second feedback loop which includes a second controlled object that has a second transfer function and includes a substrate stage that supports the substrate, and is configured to control a position of the substrate stage; and
a feedback unit which includes a first calculator, and is configured to feed back a synchronization error between the original stage and the substrate stage to the first feedback loop and the second feedback loop via the first calculator,
wherein the first feedback loop includes a second calculator which has a third transfer function and receives a position error of the original stage, an output from the second calculator being provided to the first controlled object after an output from the first calculator is added thereto,
the second feedback loop includes a third calculator which has a fourth transfer function and receives a position error of the substrate stage, an output from the third calculator being provided to the second controlled object after an output from the first calculator is subtracted therefrom, and
the apparatus is configured such that a product of the first transfer function and the third transfer function and a product of the second transfer function and the fourth transfer function are equal, and the exposure is performed at least during a period in which the original and the substrate are accelerated.

3. A scanning exposure apparatus which performs an exposure of a substrate to radiant energy via an original while the original and the substrate are scanned, the apparatus comprising:
a first feedback loop which includes a first controlled object that has a first transfer function and includes an original stage that supports the original, and is configured to control a position of the original stage;
a second feedback loop which includes a second controlled object that has a second transfer function and includes a substrate stage that supports the substrate, and is configured to control a position of the substrate stage;
a feedback unit which includes a first calculator having a third transfer function, and is configured to feed back a synchronization error between the original stage and the substrate stage to the first feedback loop and the second feedback loop via the first calculator;
a second calculator which has a fourth transfer function serving as a reference model, and is configured to generate a third target position, to be provided to the first feedback loop, upon receiving a first target position;
a third calculator which has the fourth transfer function, and is configured to generate a fourth target position, to be provided to the second feedback loop, upon receiving a second target position corresponding to the first target position;
a first feed-forward unit which includes a fourth calculator having a fifth transfer function as a product of the fourth transfer function and a reciprocal of the transfer function of the first controlled object, and is configured to feed-forward the first target position to the first feedback loop via the fourth calculator; and a second feed-forward unit which includes a fifth calculator having a sixth transfer function as a product of the fourth transfer function and a reciprocal of the transfer function of the second controlled object, and is configured to feed-forward the second target position to the second feedback loop via the fifth calculator, wherein the apparatus is configured such that the exposure is performed at least during a period in which the original and the substrate are accelerated.

4. An apparatus according to claim 3, wherein the first feedback loop includes a sixth calculator configured to generate a first command value for the first controlled object, the sixth calculator receiving a position error of the original stage, and generating an output to which a feedback output, that is obtained by the feedback unit and is to be fed back to the first feedback loop, is added, and the second feedback loop includes a seventh calculator configured to generate a second command value for the second controlled object, the seventh calculator receiving a position error of the substrate stage, and generating an output from which a feedback output, that is obtained by the feedback unit and is to be fed back to the second feedback loop, is subtracted.

5. A control apparatus which performs control of a process for a first object and a second object while the first object and the second object are moved, the apparatus comprising:

a first feedback loop which includes a first controlled object including a first support unit that supports the first object, and is configured to control a position of the first support unit;

a second feedback loop which includes a second controlled object including a second support unit that supports the second object, and is configured to control a position of the second support unit; and a feedback unit which includes a first calculator, and is configured to feed back a synchronization error between the first support unit and the second support unit to the first feedback loop and the second feedback loop via the first calculator, wherein the apparatus is configured such that a transfer function from a first target value for the first controlled object to a first controlled value of the first controlled object and a transfer function from a second target value for the second controlled object to a second controlled value of the second controlled object are equal, and the processing is performed at least during a period in which the first object and the second object are accelerated.

6. A scanning exposure apparatus which performs an exposure of a substrate to radiant energy via an original while the original and the substrate are scanned, the apparatus comprising: a control apparatus defined in claim 5, wherein the control apparatus is configured to perform, as the control, a control of the exposure with the original and the substrate as the first object and the second object, respectively.

7. The apparatus according to claim 6, wherein the apparatus is configured such that the exposure of the substrate to radiant energy starts during a period in which the first support unit and the second support unit are accelerated at respective positive accelerations, and radiant energy to which the substrate is exposed per unit time is proportional to a velocity of the second support unit.

8. A method of manufacturing a device, the method comprising:

exposing a substrate to radiant energy using a scanning exposure apparatus defined in claim 6;

developing the exposed substrate; and processing the developed substrate to manufacture the device.

* * * * *